United States Patent [19]

Mitsuyoshi et al.

[11] Patent Number: 4,611,164

[45] Date of Patent: Sep. 9, 1986

[54] SPECTRUM ANALYZER WITH AUTOMATIC PEAK FREQUENCY TUNING FUNCTION

[75] Inventors: Takano Mitsuyoshi, Tokyo; Mamoru Ando, Hiratsuka, both of Japan

[73] Assignee: Anritsu Electric Company Limited, Tokyo, Japan

[21] Appl. No.: 583,047

[22] Filed: Feb. 23, 1984

[30] Foreign Application Priority Data

Feb. 27, 1983 [JP] Japan .................................. 58-31154

[51] Int. Cl.⁴ ............................................ G01R 23/16
[52] U.S. Cl. .................. 324/77 B; 324/77 C; 364/485
[58] Field of Search ................. 324/77 R, 77 B, 77 C, 324/77 CS, 121 R; 364/484, 485; 455/226

[56] References Cited

U.S. PATENT DOCUMENTS

| 3,382,436 | 5/1968 | Wu ........................... 324/77 C |
| 3,641,515 | 2/1972 | Sues .......................... 364/485 |
| 4,244,024 | 1/1981 | Marzalek et al. .............. 324/77 B |
| 4,253,152 | 2/1981 | Holdaway ..................... 324/77 B |
| 4,257,104 | 3/1981 | Martin et al. ................ 324/77 B |
| 4,264,958 | 4/1981 | Rowell, Jr. et al. ........... 324/77 B |
| 4,295,093 | 10/1981 | Middleton ................... 324/77 B |

Primary Examiner—Reinhard J. Eisenzopf
Assistant Examiner—Kevin D. O'Shea
Attorney, Agent, or Firm—Frishauf, Holtz, Goodman & Woodward

[57] ABSTRACT

A spectrum analyzer having an automatic tuning capability for positioning the peak level of a frequency spectrum at a predetermined position on a display device, e.g. a CRT display, with the displayed peak level being set to a predetermined level on the display device and the frequency thereof being set as the center frequency of the display.

3 Claims, 7 Drawing Figures

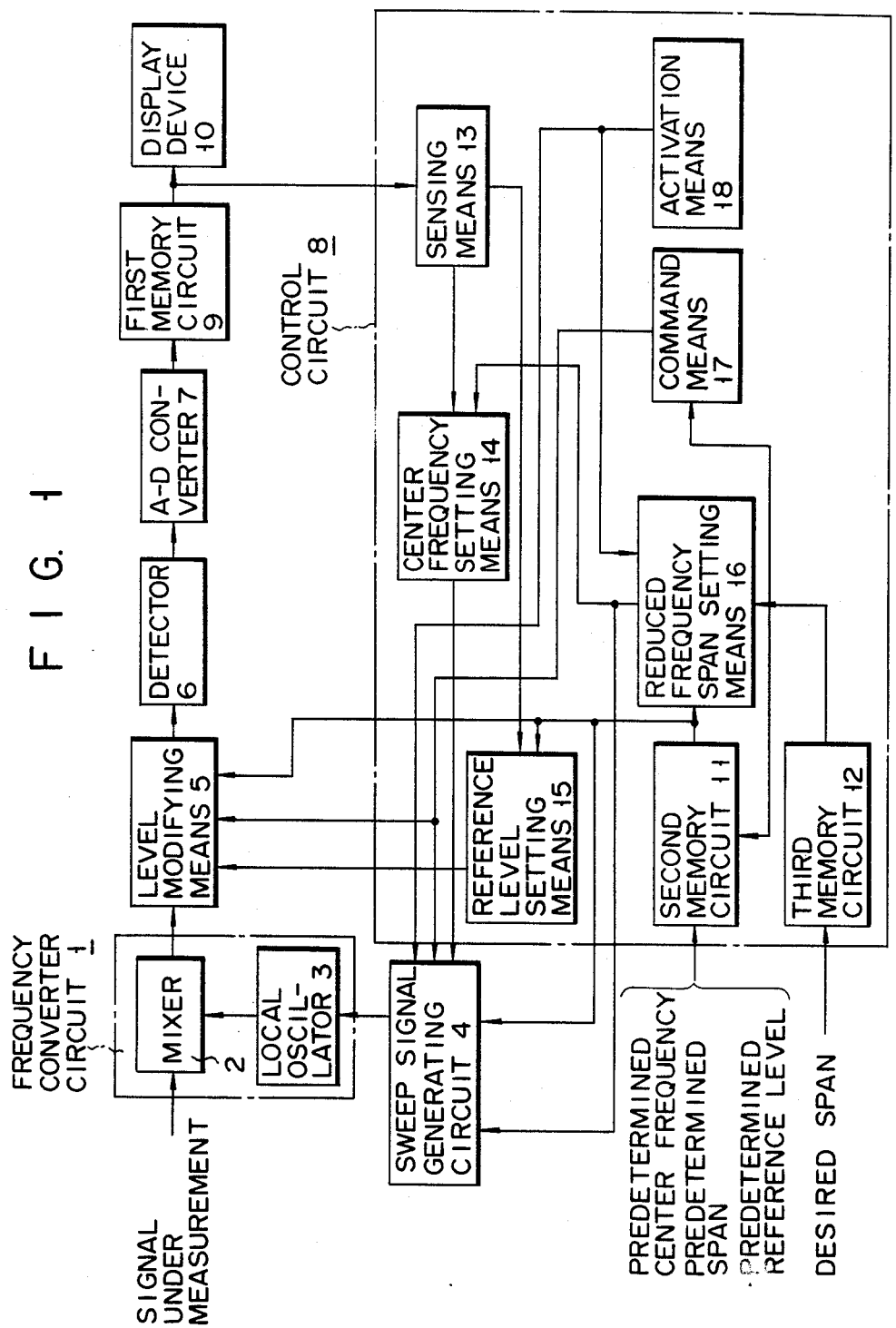

F I G. 2A
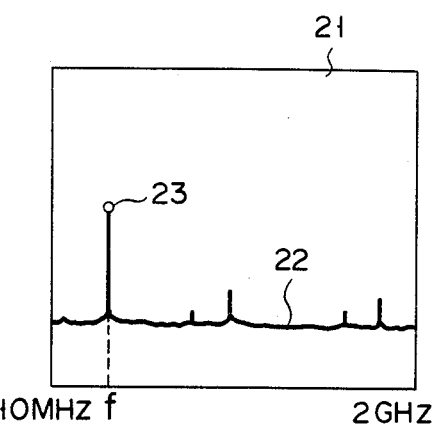
F I G. 2B
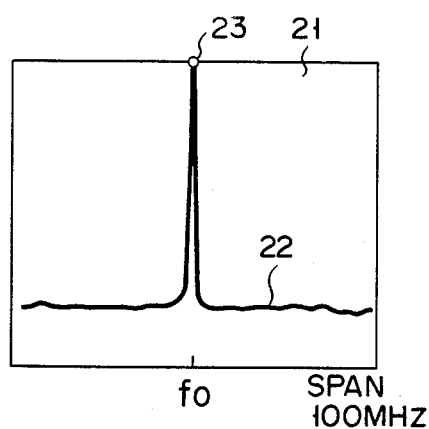
F I G. 2C
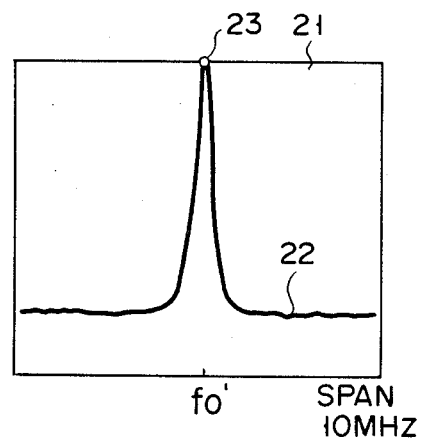
F I G. 2D
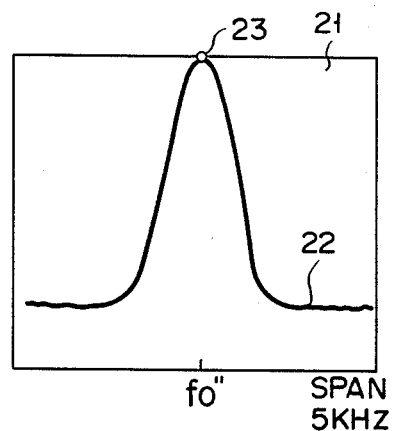

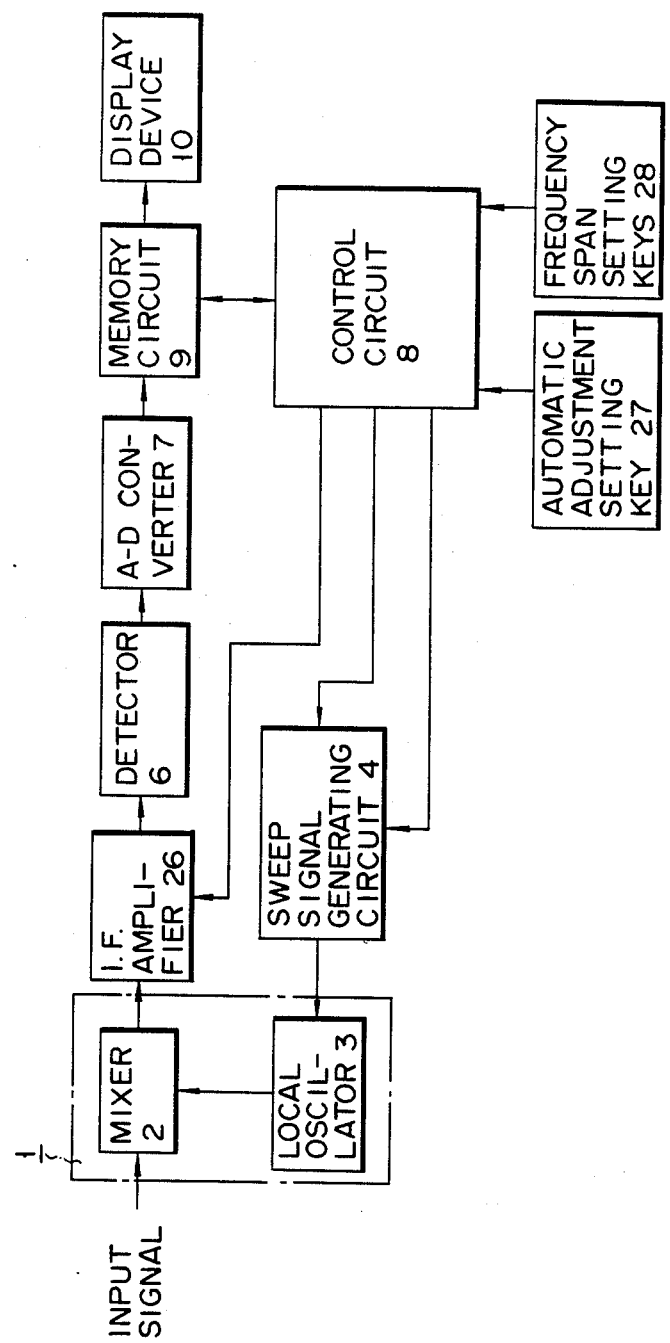

SPECTRUM ANALYZER WITH AUTOMATIC PEAK FREQUENCY TUNING FUNCTION

BACKGROUND OF THE INVENTION

Sweep-type spectrum analyzers are widely utilized to examine the spectra of various types of signal, by directly displaying the relative amplitudes of the signal frequency components, usually upon a CRT display. In many cases it is desired to examine only a single part of the frequency span of a signal, i.e. a relatively narrow frequency range within which a peak signal level occurs. In the prior art, it has been generally necessary to search through a wide range of frequencies, manually adjusting control knobs while observing the CRT display, in order to find the desired peak level and to set the center frequency of the displayed frequency span to approximately correspond to the frequency at which the signal peak occurs. In addition, it is necessary to adjust the amplitude of the displayed signal peak to a suitable level, e.g. by some form of manually adjustable gain control. In certain applications, the amount of time required for such manual operations may be unacceptable, and there is therefore an urgent need for a spectrum analyzer which will perform such adjustments to display a peak signal level of a signal spectrum in a rapid and completely automatic manner.

In the prior art, various types of signal tracking functions have been proposed, to be incorporated into a spectrum analyzer. With such a signal tracking function, the user must first set the frequency sweep range, i.e. the frequency span, to cover a wide range of frequencies, and must find the desired peak signal level from the displayed spectrum thus generated on the CRT. The frequency of this peak level can then be adjusted to a suitable position on the display, i.e. such that the peak signal level appears at about the center of the display. Thereafter, as the user narrows the frequency span down to a desired value, to enable close examination of the range of frequencies around this peak level, the spectrum analyzer automatically holds the position of the displayed peak level fixed on the display, e.g. holds the center frequency of the displayed frequency span fixed at the frequency of the desired peak signal level.

A spectrum analyzer equipped with such a signal tracking feature is less time-consuming to use than a purely manual type of spectrum analyzer. However it is still necessary for the user to initially perform manual frequency adjustment such that the desired peak signal level will appear on the CRT display, and of course also to adjust the amplitude of the displayed peak level to a suitable value. In addition, the zero-beat component may be erroneously selected and made to appear on the display, instead of the desired peak level. There is therefore a requirement for a spectrum analyzer which will perform all of the adjustment operations described above in a purely automatic manner, with no manual operations other than actuation of a push-button. Such a spectrum analyzer is proposed by the present invention.

SUMMARY OF THE INVENTION

It is an objective of the present invention to overcome the disadvantages of the prior art as described above, and to provide a spectrum analyzer having an automatic tuning function whereby actuation of an automatic tuning setting switch will cause the peak level of the spectrum of a signal to be automatically displayed at the center of a CRT display, with the displayed amplitude of this peak level being fixed at a predetermined reference level, and whereby erroneous display of a zero-beat component is eliminated.

To accomplish these objectives, a spectrum analyzer according to the present invention operates as follows. Firstly, prior to performing spectrum analysis, the value of the frequency span which is desired to display is set into the spectrum analyzer, e.g. by key actuations. An automatic adjustment switch is then actuated by the user, whereupon an initial frequency sweep of the input signal to be analyzed is carried out. This frequency sweep is carried out in the normal manner for a spectrum analyzer, e.g. by sweeping the frequency of a local oscillator whose signal is applied to a mixer together with the signal under analysis, and the resultant intermediate frequency signal is amplified and detected, with the signal resulting from the detection being displayed on a CRT. However the frequency range covered by this initial sweep, i.e. the frequency span, is made very wide. The value of this initial frequency span can be either fixedly preset, or can be made presettable by the user. The degree of signal amplification/attenuation provided during this initial frequency span is determined by a preset data value, referred to in the following as the initial reference level. Initially this data value is set such as to provide minimum signal amplification. The output signal from the detector resulting from this initial frequency sweep is input to an analog/digital converter circuit, and thereby converted into a succession of digital data values, i.e. with each digital data value representing the amplitude of the input signal under analysis at a particular frequency. These successively generated digital data values are stored in a memory circuit, i.e. with each storage address of the memory circuit corresponding to a particular frequency of the input signal under analysis. Upon completion of this initial frequency sweep and digital conversion processing, the contents of the memory circuit are successively read out, and digital processing is performed on this output data to determine the frequency at which the maximum level of the input signal being measured occurs. Next, a second frequency sweep of the input signal is performed, using a value of frequency span which is reduced from the initial frequency span by a predetermined factor (for example, making this reduced frequency span equal to 1/10 of the initial frequency span) and with this reduced frequency span being centered upon the frequency at which the peak level of the input signal being measured occurs. In addition, the value of the reference level is set equal to the measured peak signal level (as read out from the memory), and the signal amplification/attenuation during this second sweep is correspondingly modified. That is to say, if this new reference level is lower than the initial preset value, then the degree of signal amplification is increased by a corresponding amount, e.g. by increasing the intermediate frequency amplifier circuit gain.

Analog-to-digital processing of the detector output resulting from this second frequency sweep is performed, and the digital data values resulting from this are stored in the memory circuit, to be read out therefrom upon completion of the frequency sweep. The processing described above is thereafter successively repeated, with the value of the frequency span being reduced for each successive frequency sweep. When the value of the frequency span is sensed to have become equal to or less than the predetermined desired frequency span value, then frequency sweep operations are thereafter performed using that predetermined frequency span value, with the peak level of the input signal being measured now appearing at the center of the CRT and with the amplitude of that peak level being equal to the fixed reference level.

The operation of the spectrum analyzer is controlled such that the minimum frequency of the initial wide-range frequency span described above is higher than the zero-beat frequency, so that there is no possibility of the zero-beat component becoming displayed instead of the desired peak signal level of the spectrum.

BRIEF DESCRIPTION OF THE DRAWINGS

FIG. 1 is a general block diagram to illustrate the configuration of a spectrum analyzer according to the present invention;

FIGS. 2A to 2D are frequency spectrum diagrams illustrating the process whereby automatic adjustment to display a spectrum peak level is performed;

FIG. 3 is a general block diagram of an embodiment of a spectrum analyzer according to the present invention.

DETAILED DESCRIPTION OF THE PREFERRED EMBODIMENTS

Figure 4:
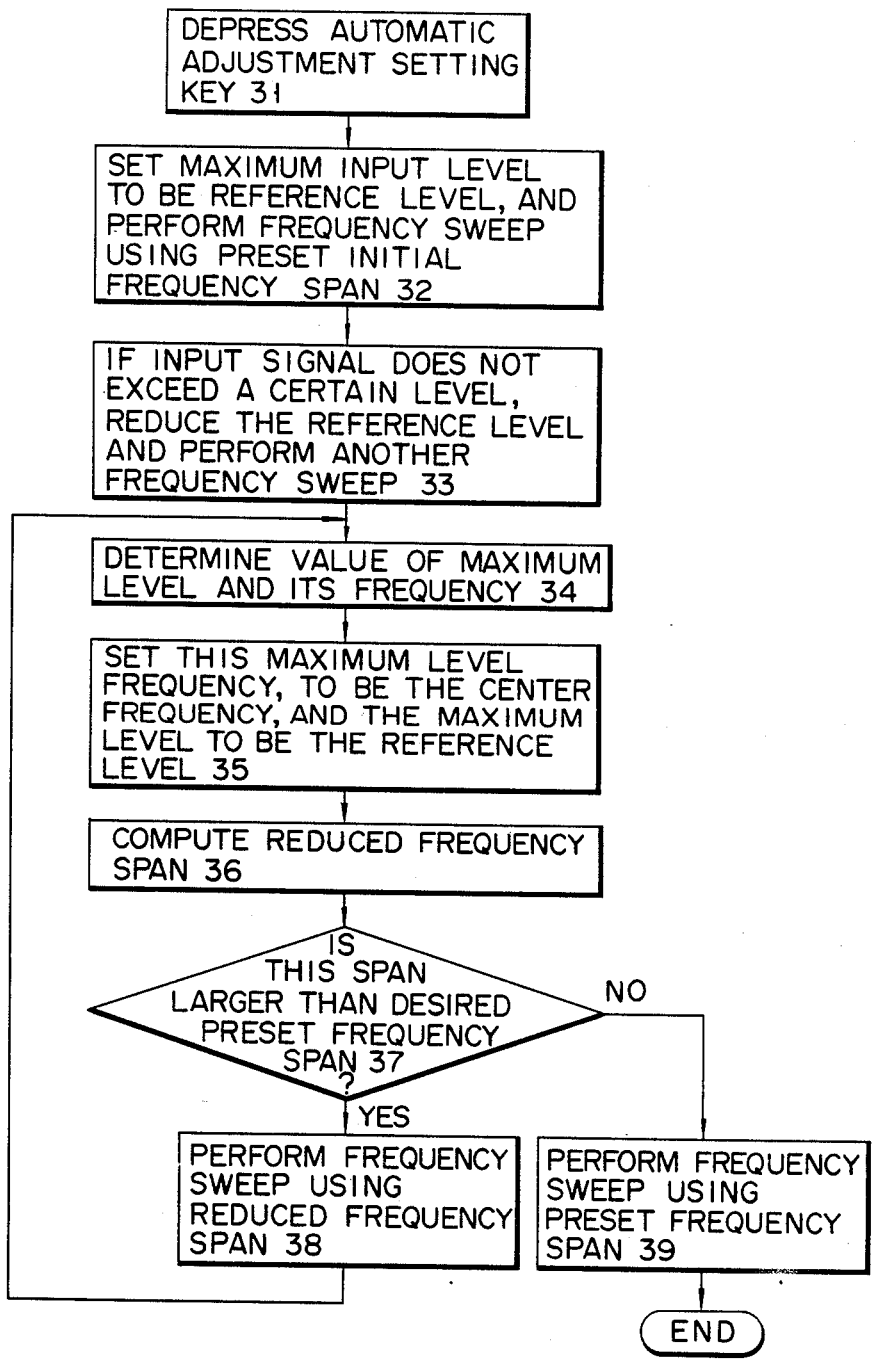
FIG. 4 is a flow chart to illustrate the operation of an embodiment of a spectrum analyzer according to the present invention.

Referring first to FIG. 1, numeral 1 denotes a frequency converter circuit, comprising a mixer 2 which is coupled to receive the input signal being measured and an output signal from a local oscillator 3. A sweep signal generating circuit 4 produces a sweep signal, e.g. a voltage ramp signal, which varies the frequency of local oscillator 3 such as to convert a specific range of input signal frequencies to the intermediate frequency, this range of frequencies being referred to in the following as the frequency span. This frequency span is determined by command signals applied to sweep signal generating circuit 4 from a control circuit 8, as described in detail hereinafter. The intermediate frequency signal output from frequency converter circuit 1 is applied through level modifying means 5 to a detector 6 (i.e. an envelope detector circuit), and a signal corresponding to the amplitude of the intermediate frequency signal is thereby produced. The output signal from detector 6 is applied to an analog/digital converter circuit 7, and is thereby successively converted into a plurality of digital data values, at successive timings determined by a clock signal (not shown in the drawing) which is appropriately synchronized with the output signal from sweep signal generating circuit 4. That is to say, during each frequency sweep, signal amplitudes corresponding to each of a plurality of successively increasing frequency values are successively converted from analog into digital signal values. The digital data values thus produced from analog/digital converter circuit 7 are successively stored in address locations of a first memory circuit 9, i.e. with each address corresponding to a specific frequency of the input signal being measured and the digital data value stored therein representing the amplitude of the input signal spectrum at that specific frequency. The memory contents are subsequently read out therefrom and displayed by a display device 10.

In control circuit 8, numeral 11 denotes a second memory circuit, in which are stored values representing a predetermined initial center frequency, a predetermined initial frequency span and a predetermined initial reference level. Reference level setting means 15 produce signals determined by the current value of the reference level, which are input to level modifying means 5 to determine a degree of amplification or attenuation provided by level modifying means 5. Numeral 13 denotes sensing means which act to detect the maximum level of the input signal being measured, i.e. represented as a digital data value stored in memory circuit 9. After each frequency sweep, the value of this maximum level is set as the reference level in reference level setting means 15. In addition, a data value derived by sensing means 13 indicating the frequency of the maximum signal level is set into center frequency setting means 14, which in turn controls the operation of sweep signal generating circuit 4 such that the frequency of the maximum level is made the center frequency of the next frequency sweep. Each successive frequency sweep is activated by activation means 18. Numeral 16 denotes reduced frequency span setting means, whereby the frequency span of successive sweeps is reduced in a predetermined manner, as described hereinafter, with output data therefrom being input to center frequency setting means 14 and to sweep signal generating circuit 4. Numeral 12 denotes a third memory circuit, in which data representing a desired frequency span value is stored. This data is set in by the user before measurement operations are initiated. Control of various operations, including initiation of each frequency sweep, is performed by signals produced by command means 17.

The operation of the system shown in FIG. 1 is as follows. The predetermined center frequency, predetermined frequency span and predetermined reference level, shown as being input to second memory circuit 11, will normally be permanently stored values, which the user need not change. When measurement operation of the spectrum analyzer is initiated, then activation means 18 and command means 17 generate signals whereby a ramp waveform signal from sweep signal generating circuit 4 causes local oscillator 3 to initiate a frequency sweep over an initial widerange frequency span which is equal to the predetermined initial frequency span value stored in second memory circuit 11. In the following, the term "reference level" denotes a level of input signal which when displayed will attain a specific reference position, e.g. a specific reference scale graduation, on the screen of the display device. The current value of this reference level is determined by the currently set values of input attenuation and IF amplification. The center frequency of the initial frequency span is made equal to the predetermined initial center frequency stored in second memory circuit 11, and the reference level value held in reference level setting means 15 is made equal to the preset initial reference level value stored in memory circuit 11. This initial reference level corresponds to the maximum level if input signal which can be displayed by the spectrum analyzer, e.g. an input signal level of +25 dBm, and accordingly, as a result of the corresponding control signals applied from reference level setting means 15 to level modifying means 5, level modifying means 5 act to provide minimum gain/maximum attenuation of the output signal from frequency converter circuit 1. The resultant output signal from detector 6 is sequentially converted into a plurality of digital data values by analog/digital converter circuit 7, which are successively stored in address locations in first memory circuit 9. Upon completion of this frequency sweep, the digital data values stored in first memory circuit 9 are read out therefrom, and displayed by display device 10. Sensing means 13 of control circuit 8 then detect the maximum level of the input signal spectrum, i.e. by detecting the maximum digital data value which is output from analog/digital converter circuit 7 and stored in memory circuit 9. This sensing can be performed either by monitoring the digital data values as they are successively output from analog/digital converter circuit 7 during the frequency sweep, or by sensing the digital data values when they are successively read out from first memory circuit 9 subsequent to each frequency sweep. If no peak level can be detected by this first frequency sweep, i.e. if the maximum signal level output from detector 6 during that frequency sweep is below the noise level, for example, if the input signal level is lower than −25 dBm, then the reference level value in reference level setting means 15 is reduced. As a result, the degree of level modification (i.e. signal gain or attenuation) provided by level modifying means 5 is changed such as to increase the signal level output therefrom, and another wide-range frequency sweep using the predetermined frequency span value is performed. If necessary, further adjustment of level modifying means 5 is performed until a peak signal level can be detected by sensing means 13.

In this way, sensing means 13 acts to detect the level of the peak signal amplitude of the input signal being measured, and also the frequency at which that peak level occurs. The peak level value thus determined is now made the reference level value in reference level setting means 15, while the center frequency value held in center frequency setting means 14 is made equal to the frequency of the peak level thus detected. As a result, reference level setting means 15 and center frequency setting means 14, generate signals which cause the frequency span of the next sweep to have as its center frequency the frequency of the maximum signal level detected as described above, and such that the amplitude of this maximum signal level (i.e. after output from level modifying means 5) will correspond to the reference level.

A second frequency sweep with a reduced frequency span is now initiated by activation means 18, with the frequency span value being determined by reduced frequency span setting means 16 and the center frequency of the frequency span being equal to the frequency of the input signal maximum level. The output signal from detector 6 is again converted into a succession of digital data values by analog/digital converter circuit 7, which are sequentially stored in first memory circuit 9. The maximum signal level and the corresponding frequency are again sensed by sensing means 13. The process described above is then repeated, with the value of frequency span being again reduced and with the center frequency of the frequency span being equal to the last-determined frequency of the signal peak level, and with the reference level value in reference level setting means 15 being the value of the peak level detected by sensing means 13 following the previous frequency sweep.

Normally, the frequency span will be reduced by a fixed factor on successive frequency sweeps, for example, each frequency span value might be 1/10 of the preceding frequency span value. Further frequency sweeps are successively performed thereafter, with successively narrowing values of frequency span, until reduced frequency span setting means 16 detects that the frequency span value has become equal to or less than the desired frequency span value which is stored in third memory circuit 12. When this condition is detected, then thereafter the frequency span is held fixed at this desired frequency span value, so that the peak signal level now appears displayed at the center of the display provided by display device 10, with the peak amplitude being set to the predetermined reference level.

The lowest frequency of the initial wide-range frequency span, whose value is stored in second memory circuit 11, is selected to be higher than the maximum zero-beat signal frequency that can be anticipated. In this way, there is no danger that the zero-beat component will be selected to appear at the center of the display, even if it is of larger amplitude than the actual peak value of the input signal being measured.

The above series of operations are illustrated in FIGS. 2A to 2D. FIG. 2A illustrates an example of a spectrum 22 which appears on display device 10 following an initial frequency sweep with the wide-range frequency span as described above. A marker 23 is automatically positioned at the peak signal level. In this example, the predetermined initial frequency span extends from 10 MHz to 2 GHz, i.e. the lowest frequency of this range is selected such as to exclude the zero-beat component. In a subsequent reduced frequency span of 100 MHz, as shown in FIG. 2B, the amplitude of the peak signal level has been set to the reference level. As shown, this would normally be set to correspond to the maximum level which can be displayed by the display device, e.g. the maximum display screen graduation. In addition, the measured frequency at which the peak signal value occurs, designated as $f_0$ has been set to the center of the display as shown. Assuming that the frequency span is reduced by a factor of 1/10 on successive frequency sweeps, then the spectrum displayed following the next frequency sweep will be as shown in FIG. 2C, with a reduced frequency span of 10 MHz being utilized. The newly computed frequency of the signal peak level, $f_0'$ following this frequency sweep is now set to correspond to the center frequency of the display. It should be noted that as the number of successively repeated frequency sweeps increases, the degree of precision attained in measuring the frequency of the peak signal level will increase, so that the measured frequency value will vary slightly.

Assuming that the desired frequency span value which has been set into third memory circuit 12 as described above is 5 KHz, then after a plurality of subsequent frequency sweeps the reduced frequency span will become equal to 10 KHz, and on the next sweep the frequency span will become 1 KHz. Since this is less than the desired preset frequency span, the frequency span of the next sweep will be made the desired frequency span value, i.e. 5 KHz. As a result, the final displayed frequency spectrum will be as shown in FIG. 2D, with the precisely determined frequency $f_0''$ of the peak signal level 23 being positioned at the center of the display as shown, the frequency span fixed at 5 KHz, and with the peak level being set to the reference level.

It will be apparent that the configuration of control circuit 8 can be readily implemented by combinations of well-known types of digital circuits, or a suitably programmed microprocessor, with digital-to-analog conversions means being utilized where necessary to convert output signals from control circuit 8 into suitable form for controlling the operation of sweep signal generating circuit 4, level modifying means 5, etc., and with second and third memory circuits 11 and 12 being implemented respectively as ROM and RAM circuits respectively with suitable data input means coupled thereto, or simply as sets of switches. For this reason, no detailed description will be given of examples of circuits for control circuit 8.

FIG. 3 is a general block diagram of an embodiment of a spectrum analyzer according to the present invention. In this embodiment, the level modifying means 5 of FIG. 1 are constituted by an intermediate frequency amplifier 26 whose gain can be voltage-controlled by a signal applied from control circuit 8 as shown, with the level of the latter control signal being determined by the current value of reference level which is held in the reference level setting means in control circuit 8. The sequence of operations described above, whereby the peak level of an input signal being measured is positioned at the center of the display provided by display device 10, is initiated by actuation of an automatic adjustment key 27. The desired frequency span is input by actuation of frequency span setting keys 28.

The operation of the embodiment of FIG. 3 is summarized in the flow chart of FIG. 4. Assuming that the user has preset a desired value of frequency span into control circuit 8 by means of keys 28, then when key 27 is actuated, as illustrated by step 31, an initial wide-range frequency sweep is performed using the maximum input signal level which can be displayed by the spectrum analyzer as the reference level, the predetermined initial frequency span, and the predetermined initial center frequency for that span, as indicated by step 32. If no peak signal can be detected following this sweep, then the reference level value is reduced (thereby causing the control signal applied from control circuit 8 to intermediate frequency amplifier 26 to increase the IF gain), and another wide-range frequency sweep is performed using the predetermined initial frequency span and center frequency values. This process is repeated if necessary until a peak level of the input signal being measured is detected. Following this stage (indicated by step 33 in FIG. 4), the value of the peak level, and its frequency, are derived, as indicated by step 34. Next, the peak level thus derived is set as the reference level (thereby correspondingly altering the gain of intermediate frequency amplifier 26), and the frequency of that peak level is set as the center frequency for the next sweep, as indicated by step 35. The reduced frequency span to be used for the next frequency sweep is then computed, as indicated by step 36. If this computed frequency span is found to be greater than the preset desired frequency span, then as indicated by step 38, a sweep is performed using this reduced frequency span value, and the process thereafter returns to step 34. If on the other hand the reduced frequency span value is found to be equal to or less than the desired preset frequency span, then a sweep is performed using that desired frequency span, as indicated by step 39, so that the portion of the spectrum of the input signal being measured containing the peak level is now displayed centrally on the display device.

From the above description it can be understood that a spectrum analyzer according to the present invention enables the peak level of the spectrum of a signal under measurement to be rapidly and automatically detected and displayed with a desired preset frequency span at the center of a display, with the displayed level being fixed at a constant reference level. No manual operations, other than an initial switch actuation, are necessary, so that such a spectrum analyzer can be utilized effectively even by unskilled personnel.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. A spectrum analyzer, comprising:

frequency converter circuit means comprising a local oscillator circuit and a mixer coupled to receive an output signal from said local oscillator circuit and an input signal whose spectrum is to be displayed, for converting said input signal to an intermediate frequency signal;

sweep signal generating means coupled to said local oscillator circuit to control the frequency thereof;

level modifying means coupled to receive said intermediate frequency signal from said frequency converter circuit means for controlling the level thereof;

detector circuit means coupled to receive said intermediate frequency signal from said level modifying means, for producing a detection signal representing the amplitude of said intermediate frequency signal;

analog/digital converter circuit means for converting said detection signal to digital data values;

first memory circuit means for storing said digital data values from said analog/digital converter circuit means;

display means for displaying the contents of said first memory circuit means; and control circuit means coupled at least to said sweep signal generating means, to said level modifying means and to an output of said first memory circuit means for storing a predetermined initial frequency span, predetermined initial center frequency and a predetermined initial reference level, coupled to data input means operable to preset therein a desired frequency span value, and operable to first initiate generation of a signal from said sweep signal generating means whereby said local oscillator circuit output signal is first swept over a frequency range corresponding to said predetermined initial frequency span which is centered on said predetermined initial center frequency and whereby said level modifying means performs level control of said intermediate frequency signal in accordance with said predetermined initial reference level, with a plurality of levels of said intermediate frequency signal generated during said first sweep being converted into digital data values and successively stored in addresses of said first memory circuit means, said control circuit means further acting to determine from said digital data values of said first sweep the peak level of the frequency spectrum of said input signal within said predetermined initial frequency span and the frequency of said peak level and to set the value of said peak level as a reference level and to control said level modifying means such as to increase the gain or decrease the attenuation provided by said level modifying means in accordance with an amount of decrease of said reference level from said predetermined initial reference level, and further acting (a) to set the frequency of spectrum analyzer peak level as the center frequency of a second sweep, (b) to reduce the frequency span of said second sweep to be less than said predetermined initial frequency span by a predetermined factor and (c) to store the levels of said intermediate frequency signal resulting from said second sweep in said memory circuit means as digital data values and moreover (d) to determine from said digital data values the maximum level of said input signal spectrum during said second sweep and the frequency thereof and to set said maximum level to said reference level and said peak level frequency to be the center frequency of a succeeding sweep of reduced frequency span, and moreover to initiate a plurality of subsequent frequency sweeps with each of steps (a), (b), (c) and (d) above being performed for each of said subsequent sweeps with successively reduced values of frequency span, until said desired preset frequency span is attained, said control circuit means acting thereupon to initiate at least one frequency sweep with said preset desired frequency span as the frequency span thereof.

2. A spectrum analyzer according to claim 1, in which said control circuit means comprises:
second memory circuit means for storing said predetermined initial frequency span, said predetermined initial center frequency and said predetermined initial reference level;
third memory circuit means for storing said desired frequency span value;
sensing means for detecting said peak level from said digital data values and calculating the frequency thereof;
reference level setting means for selectively producing signals to control said level modifying means in accordance with predetermined initial reference level and said reference level values derived from said peak levels;
center frequency setting means for selectively producing signals applied to said sweep signal generating means to determine the center frequency of each frequency sweep in accordance with said predetermined initial center frequency and said peak level frequency values;
reduced frequency span setting means for producing signals to control said sweep signal generating means during said first sweep in accordance with said predetermined initial frequency span and thereafter in accordance with successively reduced frequency span values; and
command and activation circuit means for generating control signals and activation signals including signals to repetitively initiate said plurality of successive frequency sweeps.

3. A spectrum analyzer according to claim 1, in which said level modifying means comprises an intermediate frequency amplifier circuit whose gain is controlled by a control signal from said control circuit means in accordance with the current value of said reference level.

* * * * *